United States Patent
Reuter

(10) Patent No.: US 9,620,854 B2
(45) Date of Patent: Apr. 11, 2017

(54) ELECTRONIC HIGH FREQUENCY DEVICE AND MANUFACTURING METHOD

(71) Applicant: Ralf Reuter, Munich (DE)

(72) Inventor: Ralf Reuter, Munich (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/655,134

(22) PCT Filed: Jan. 9, 2013

(86) PCT No.: PCT/IB2013/050192
§ 371 (c)(1),
(2) Date: Jun. 24, 2015

(87) PCT Pub. No.: WO2014/108744
PCT Pub. Date: Jul. 17, 2014

(65) Prior Publication Data
US 2015/0325908 A1    Nov. 12, 2015

(51) Int. Cl.
*H01Q 1/38* (2006.01)
*H01Q 13/00* (2006.01)
(Continued)

(52) U.S. Cl.
CPC .......... *H01Q 1/38* (2013.01); *G01S 7/03* (2013.01); *G01S 13/02* (2013.01); *H01L 23/552* (2013.01);
(Continued)

(58) Field of Classification Search
CPC ....... H01Q 1/38; H01L 21/3205; H01P 1/047; H01P 5/107; H01P 3/00; H01P 3/16; H04W 52/0245
(Continued)

(56) References Cited

U.S. PATENT DOCUMENTS 5,892,256 A * 4/1999 Matsushita ......... H01L 27/1082
                                                            257/301
6,154,176 A   11/2000 Fathy et al.
(Continued)

FOREIGN PATENT DOCUMENTS

JP      57028401      2/1982
JP      2009141386    6/2009

OTHER PUBLICATIONS

International Search Report and Written Opinion correlating to PCT/IB2013/050192 issued on Oct. 16, 2013.
(Continued)

*Primary Examiner* — Lam T Mai
(74) *Attorney, Agent, or Firm* — Charlene R. Jacobsen

(57) ABSTRACT

An electronic device includes a wiring board having one or more layers, an integrated circuit arranged on the wiring board, an antenna, and a signal path. The integrated circuit generates a high frequency signal and feeds it to the signal path. The signal path conveys the high frequency signal to the antenna. The antenna emits the high frequency signal into an environment of the electronic device. Alternatively or in addition, the antenna receives the high frequency signal from the environment and feeds it to the signal path. The signal path conveys the high frequency signal to the integrated circuit. The integrated circuit processes the high frequency signal. The signal path includes a wave guide that traverses one or more of the layers of the wiring board.

21 Claims, 3 Drawing Sheets

(51) Int. Cl.
  H05K 3/00    (2006.01)
  G01S 13/02   (2006.01)
  G01S 7/03    (2006.01)
  H01L 23/66   (2006.01)
  H01L 25/065  (2006.01)
  H01L 23/552  (2006.01)
(52) U.S. Cl.
  CPC .......... *H01L 23/66* (2013.01); *H01L 25/0655* (2013.01); *H01Q 13/00* (2013.01); *H05K 3/0094* (2013.01); *H01L 2224/16225* (2013.01); *Y10T 29/4902* (2015.01)
(58) Field of Classification Search
  USPC .......... 343/700 MS; 455/522; 333/254, 239, 333/248
  See application file for complete search history.

(56) References Cited

U.S. PATENT DOCUMENTS

| | | | |
|---|---|---|---|
| 6,297,551 | B1 | 10/2001 | Dudderar et al. |
| 6,713,685 | B1 | 3/2004 | Cotton |
| 7,752,911 | B2 | 7/2010 | Schultheiss |
| 8,293,588 | B2* | 10/2012 | Tang ................... H01L 21/6835 257/E23.124 |
| 2004/0118599 | A1* | 6/2004 | Chason ............... B81C 1/00333 174/260 |
| 2005/0156789 | A1 | 7/2005 | Mohamadi |
| 2009/0015485 | A1 | 1/2009 | Floyd et al. |
| 2009/0091506 | A1 | 4/2009 | Navarro et al. |
| 2009/0237255 | A1 | 9/2009 | Rofougaran |
| 2010/0193935 | A1 | 8/2010 | Lachner et al. |
| 2010/0231332 | A1* | 9/2010 | Sugimoto ............... H01P 5/107 333/254 |
| 2012/0013499 | A1 | 1/2012 | Hayata |
| 2012/0104574 | A1 | 5/2012 | Boeck et al. |
| 2012/0252522 | A1* | 10/2012 | Uchida ............. H04W 52/0245 455/522 |

OTHER PUBLICATIONS

Hasch, Jürgen et al. "Milimeter-wave technology for automotive radar sensors in the 77Ghz frequency band", IEEE Transactions on Microwave Theory and Techniques, Nov. 17, 2011.

* cited by examiner

ELECTRONIC HIGH FREQUENCY DEVICE AND MANUFACTURING METHOD

FIELD OF THE INVENTION

This invention relates to an electronic high frequency device and a manufacturing method.

BACKGROUND OF THE INVENTION

High frequency (HF) electromagnetic wave emitting or receiving devices may be provided in form of one or more integrated circuits. The integrated circuits may be arranged on a wiring board, e.g., a printed circuit board (PCB). An emission or a reception antenna that is suitably coupled to the integrated circuits may be arranged on the wiring board or be integrated therein. The wiring board may comprise one or more conductive layers and one or more isolating layers arranged atop each other in an alternating manner so that there is an isolating layer between each pair of adjacent conductive layers. Various electronic components such as conductors, capacitors, inductors, or microstrip lines may be integrated in the conductive layers.

An isolating layer may comprise or consist of a suitable dielectric isolating material. Isolating materials having a relatively low dielectric constant may be preferred in the case of high frequency applications. For instance, an isolating layer arranged next to a conductive layer comprising a high frequency signal line may be made of an isolating material having a dielectric constant of approximately 3, whereas isolating layers not adjacent to any high frequency signal line may be made of an isolating material having a dielectric constant of, e.g., 4.4. Examples of isolating materials with suitably low dielectric constants include the materials RT5880 and RO3003 produced by the Rogers Corporation (USA). These materials are known to be suitable for high frequency applications involving frequencies up to 40 gigahertz or even higher frequencies. However, a variety of other isolating materials and notably some Teflon-based materials may also be suitable.

In this application, the expressions "special isolating material" and "normal isolating material" are used to distinguish between two different isolating materials, wherein the special isolating material has a lower dielectric constant than the normal isolating material. Furthermore, the special isolating material may have a much lower loss tangent at high frequencies, which may be beneficial for operation at higher frequencies, e.g., above 1 GHz. The special and the normal isolating materials may, for instance, have a dielectric constant of approximately 3 and approximately 4.4, respectively. Today's special isolating materials tend to be more expensive than normal isolating materials.

SUMMARY OF THE INVENTION

The present invention provides an electronic high frequency device and a manufacturing method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
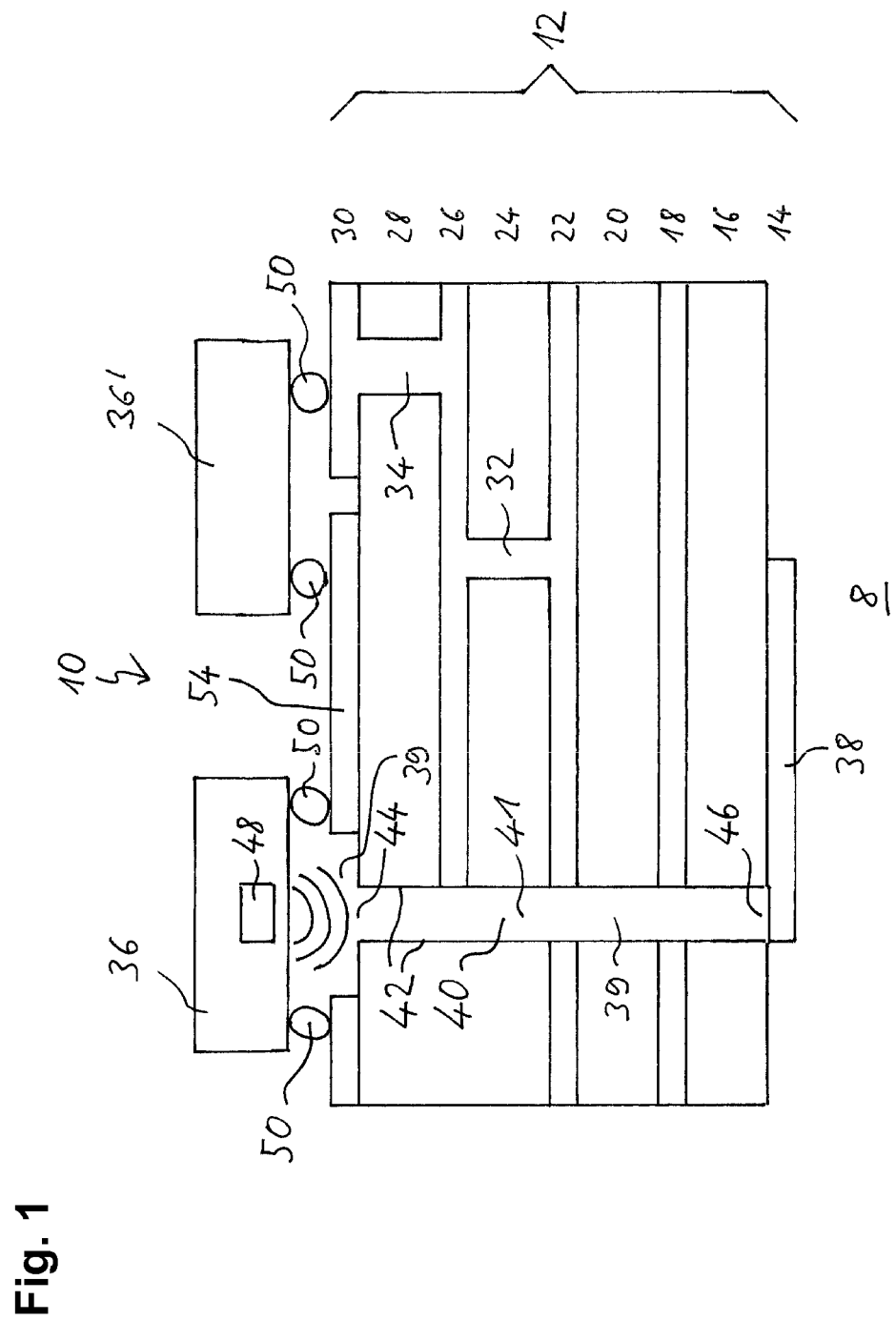
FIG. 1 schematically shows an example of an embodiment of a HF device.

FIG. 1 schematically shows an example of an electronic device 10 situated in an environment 8. The electronic device 10 may notably comprise a wiring board 12, an integrated circuit 36, an antenna 38, and a signal path 39 for conveying a high frequency signal from the integrated circuit 36 to the antenna 38 or vice versa. The wiring board 12 may comprise one or more layers. In the shown example, the wiring board 12 may, for example, comprise conductive layers 14, 18, 22, 26, and 30 and isolating layers 16, 20, 24, and 28. The conductive layers and the isolating layers may be stacked atop each other in an alternating manner. Each conductive layer, e.g., layer 30, may thus be separated from an adjacent conductive layer, e.g., layer 26, by an isolating layer, e.g., layer 28, arranged in-between. Separate conductive layers, e.g., layers 22, 26, and 30, may be interconnected by conductive wires, e.g., wires 32 and 34.

The integrated circuit 36 may be arranged on the wiring board 12. The integrated circuit 36 may notably be attached to a top or bottom conductive layer by means of, e.g., bond wires or solder balls. In the shown example, the integrated circuit 36 is attached and conductively connected to the conductive layer 30, which in this example may be the top layer, by means of several, e.g., two, three, or more, solder balls 50. The antenna 38 may be located on a layer that may comprise or consist of a special isolating material. The other layers may comprise or be composed of a normal isolating material.

The integrated circuit 36 may be arranged to generate a high frequency (HF) signal and to feed it to the signal path 39. The signal path 39 may convey the HF signal to the antenna 38. The antenna 38 may further emit the HF signal into the environment 8.

Alternatively or in addition, the antenna 38 may be arranged to receive an HF signal from the environment 8 and to feed it to the signal path 39. The signal path 39 may convey the HF signal to the integrated circuit 36. The integrated circuit 36 may further process the HF signal.

The signal path 39 may comprise a wave guide 40. The wave guide 40 may be hollow. The wave guide may, for example comprise an empty or air-filled inner space 41 delimited by an inner surface 42. The wave guide 40 may traverse one or more of the layers of the wiring board 12. In the shown example, the wave guide 40 traverses the layers 16, 18, 20, 22, 24, 26, 28, and 30. The wave guide 40 may be arranged to convey the HF signal in form of an electromagnetic wave and may be implemented efficiently without using any special isolating material. For instance, the isolating layers, e.g., layers 16, 20, 24 and 28, that are traversed by the wave guide 40 may be made of a normal isolating material, i.e., an isolating material having a relatively high dielectric constant, e.g., a dielectric constant larger than 4, for example. The wave guide 40 thus provides a means of transferring the HF signal from the integrated circuit 36 to the antenna 38 or vice versa in a cost efficient manner. The wave guide 40 may notably traverse isolating layers having a relatively high dielectric constant, e.g., a dielectric constant larger than, e.g., 4 and which may, therefore, be relatively cheap. In the shown example, the isolating layers 28, 24, and 20 may be made of a normal isolating material, whereas the isolating layer 16 adjoining the high frequency antenna 38 may be made of a special isolating material, i.e., a material having a lower dielectric constant than the normal isolating material. The antenna 38 may be part of the wiring board 12 or be attached to it. In the shown example, the antenna 38 is formed in the top or bottom conductive layer 14. The antenna 38 may have a geometric shape and size adapted to the wave length of the HF signal to be emitted or received.

The wave guide 40 may have a first end 44 arranged near the integrated circuit 36 so that the HF signal may be conveyed between the first end 44 and the integrated circuit 36 by non-conductive electromagnetic coupling. The integrated circuit 38 may, for instance, comprise a radiative coupling element 48, e.g., a microantenna, for feeding the HF signal into the wave guide 40 at the first end 44 or for receiving the HF signal from the wave guide at the first end 44. The dimensions of the radiative coupling element 48 may roughly correspond to the cross-section of the wave guide 40 at the first end 44. The radiative coupling element 48 may notably be smaller than the antenna 38.

The wave guide 40 may further have a second end 46 located near the antenna 38 so that the HF signal may be conveyed between the second end 46 and the antenna 38 by non-conductive electromagnetic coupling. The second end 46 may, for example, be located adjacent to an end section of the antenna 38.

The wave guide 40 may be straight and traverse the respective layers of the wiring board 12 perpendicularly. The integrated circuit 36 and the antenna 38 may in this case be opposite to each other with respect to the wiring board 12. The length of the wave guide 40 and associated manufacturing costs may thus be reduced. The wave guide 40 may, for instance, be produced by drilling a perpendicular hole into the wiring board 12. The hole may extend from one side of the wiring board 12 (in the example shown, the side of layer 30) to a position near or adjoining the antenna 38. In a design in which the antenna 38 is implemented in a top or bottom layer of the wiring substrate 12, the hole may traverse all but this top or bottom layer (layer 14 in FIG. 1). In an alternative design in which the antenna 38 is not part of the wiring board 12 but attached to it, the hole may traverse the entire wiring board 12.

An inner surface of the hole may be made reflective for the high-frequency electromagnetic wave of the HF signal. The inner surface may, for instance, be coated by a suitable metal. A metal vapour may to this end be introduced into the hole. The metal vapour or part of it may settle on the inner surface and thus render the inner surface reflective. Alternatively or in addition, one or more reflective elements may be attached on the inner surface of the hole. The reflective elements may, for instance, be fine metal wires or a fine mesh of metal wires.

The solder balls 50 between the integrated circuit 36 and the wiring board 12 or at least some of these solder balls, e.g., two or more of them, may form part of the hollow wave guide 40 in the sense that they may reduce leakage of the HF electromagnetic wave between the integrated circuit 36 and the wiring board 12. It may notably be beneficial to arrange two, three, four, or more solder balls onto a contour surrounding the end 44 of the wave guide 40 near the integrated circuit 36.

The wave guide 40 may have a cylindrical inner space 41. The cylindrical inner space may notably have a circular cross-section. The wave guide 40 may thus be conveniently produced in a raw wiring board by drilling a hole in the wiring board.

In one example, the integrated circuit 36 may comprise both receiver and emitter circuitry and the antenna 38 may accordingly serve for both emitting and receiving. In another example, the integrated circuit 36 may comprise an emitter circuit but not necessarily a receiver circuit, and the electronic device 10 may comprise a second integrated circuit 36' comprising a receiver circuit. The electronic device 10 may comprise further integrated circuits (not shown) on the wiring board 12. The second integrated circuit 36' may be arranged on the same layer of the wiring board 12 as the integrated circuit 36 (first integrated circuit). The electronic device 10 may further comprise a reception antenna 38' (second antenna, shown in FIG. 2) and a reception signal path 39'. The reception antenna 38' may be arranged to receive a high frequency signal as a reception signal from the environment 8 and to feed it to the reception signal path 39'. The reception signal path 39' may convey the reception signal to the second integrated circuit 36' which may further process it. The reception signal path 39' may be similar in design to the emission signal path 39 as described above. It may notably comprise a wave guide (not shown), e.g., a hollow wave guide, for conveying the received high frequency signal to the second integrated circuit 36'.

The first integrated circuit 36 and the second integrated circuit 36' may, for example, be part of a radar device, mobile phone, or other kind of transceiving device. An example of a radar device is described further in reference to FIG. 2.

Figure 2:
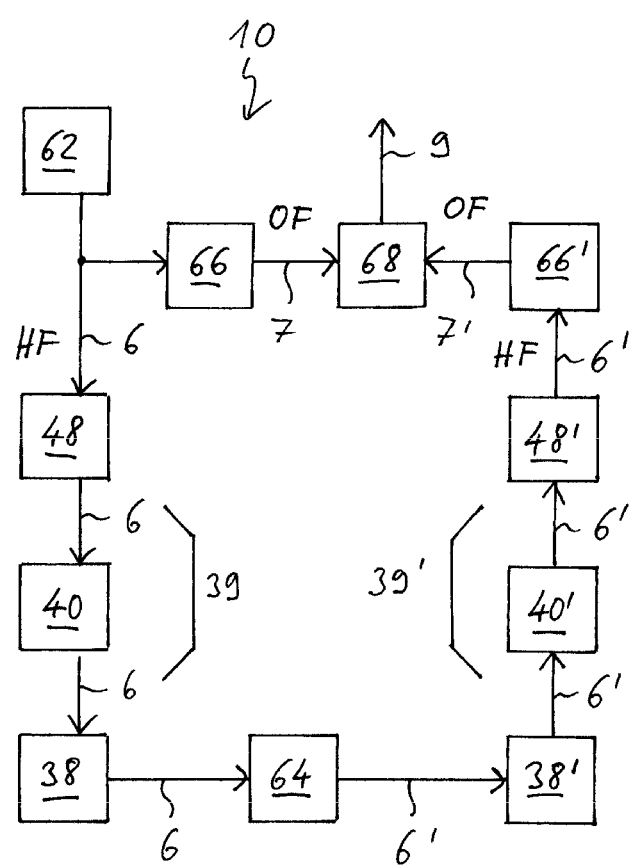
FIG. 2 schematically shows an example of an embodiment of the radar device of FIG. 1.

As shown in FIG. 2, a generator unit 62 arranged in, e.g., the first integrated circuit 36, may generate a high frequency signal 6. The HF signal 6 may have a frequency higher than, e.g., 1 gigahertz. The frequency may, for instance, be 77 gigahertz, a frequency commonly used in today's automotive radar applications. The HF signal 6 may be suitably modulated. The HF signal 6 may be fed to the antenna 38 via the radiative element 48 and the wave guide 40. The antenna 38 may emit the HF signal 6. The HF signal 6 may be reflected by an object 64 external to the electronic device 10. The external object 64 may be situated in the environment 8 (see FIG. 1). The reflected HF signal 6' may be received by the reception antenna 38' and transferred to a downconverter 66' located in, e.g., the second integrated circuit 36', via a second wave guide 40' and a second coupling element 48' connected to the down-converter 66'. The coupling elements 48 and 48' may be similar in design.

The integrated circuit 36 may further comprise a down-converter 66 for down-converting the HF signal 6 output by the generator unit 62 to an operating frequency (OF) lower than the original high frequency of the signal 6 to generate an OF signal 7. Similarly, the down-converter 66' may down-convert the received high frequency signal 6' to the operating frequency, thereby generating an OF signal 7'. The OF signals 7 and 7' may be fed to an analysis unit 8. The analysis unit 8 may determine a delay of the second OF signal 7' relative to the first OF signal 7 to generate a distance signal 9 indicative of a distance of the object 64 relative to the electronic device 10.

The analysis unit 68 may be located in the first integrated circuit 36, in the second integrated circuit 36', or in a third integrated circuit (not shown) of the electronic device 10. In any case, the first OF signal 7 or the second OF signal 7' or both may be transferred via one or more conductors integrated in or arranged on the wiring board 12.

In an example in which the analysis unit 68 is integrated in the second integrated circuit 36', the OF signal 7 may be transferred from the first integrated circuit 36 to the second integrated circuit 36' via, e.g., an OF signal line 54 of the wiring board 12 (see again FIG. 1). In the shown example, the OF signal line 54 is integrated in the conductive layer 30.

Alternatively, now considering an example in which the analysis unit 68 is integrated in the first integrated circuit 36, the second OF signal 7' may be transferred from the second integrated circuit 36' to the first integrated circuit 36 via the OF signal line 54.

The operating frequency may be chosen sufficiently low so as to avoid the need to use a special isolating material in any isolating layer located adjacent to the OF signal line 54. In the example of FIG. 1, for instance, the isolating layer 28 adjacent to the OF signal line 54 may be made of a normal isolating material, e.g., an isolating material having a dielectric constant greater than 4. Down-conversion of both the generated and the received high frequency signal 6 and 6' to an operating frequency that is substantially lower than the frequency of the HF signals 6 and 6' may thus allow for a further reduction in cost. The OF signals 7 and 7' may, for instance, have a frequency of less than 1 gigahertz or even less than 100 megahertz.

Figure 3:
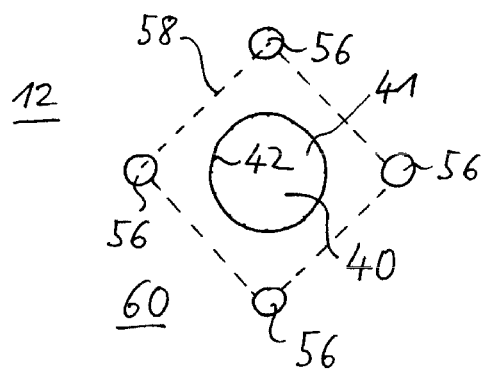
FIG. 3 schematically shows an example of an embodiment of a wave guide.

Referring now to FIG. 3, an example of the wave guide 40 is further described. It is noted that a reflective coating on the inner surface 42 of the wave guide 40 may be insufficient for preventing leakage of the HF signal 6 from the inner space 41 of the wave guide 40 into a region 60 surrounding the wave guide 40. The region 60 surrounding the wave guide 40 may be further shielded against the high frequency signal leaking from the wave guide 40 by means of several conductive vias 56 extending parallel to the wave guide 40, e.g., perpendicular to the one or more layers of the wiring board 12. The vias 56 may each have a diameter that may be considerably shorter than a diameter of the wave guide 40 and may therefore also be referred to as microvias 56. Each microvia 56 may be produced by drilling a fine hole parallel to the wave guide 40 and then filling the hole with a suitable metal. The microvias 56 may be arranged on a contour 58 surrounding the wave guide 40. The contour 58 may be arranged in a plane parallel to the one or more layers of the wiring board 12, i.e., orthogonal to a longitudinal axis (not shown) of the wave guide 40. FIG. 3 gives a schematic cross-sectional view of an example of the wave guide 40 and the microvias 56.

Figure 4:
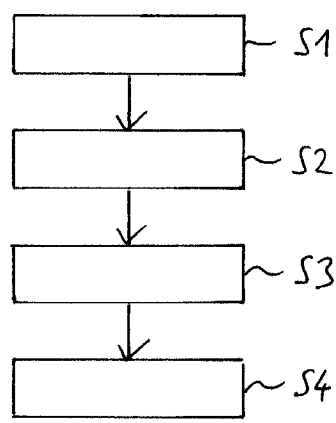
FIG. 4 shows a flow chart of an example of a method of manufacturing a high frequency emitting or receiving device.

A method for manufacturing the electronic device 10 is further explained in reference to FIG. 4. The method may start with providing an unfinished (raw) wiring board 12. A hole may then be generated, e.g., drilled, into the wiring board 12 to generate the inner space 41 of the wave guide 40 (block S1). Microvias 56 may be drilled parallel and surrounding the inner space 41 of the wave guide 40 (block S2). The inner surface 42 of the wave guide 40 may be clad with a metal substance to make it reflective for the electromagnetic wave representing the HF signal 6 (S3). Furthermore, a metal may be introduced into the holes of the microvias 56, thereby rendering the microvias 56 reflective for the electromagnetic wave in the wave guide (block S4). The antenna 38 may be formed in a subsequent step (not shown), either by processing an antenna layer (e.g., layer 14) of the wiring board 12 to generate the antenna 38 or by attaching the antenna 38 to the wiring board.

In the foregoing specification, the invention has been described with reference to specific examples of embodiments of the invention. It will, however, be evident that various modifications and changes may be made therein without departing from the broader spirit and scope of the invention as set forth in the appended claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device comprising:
   a wiring board having one or more layers;
   an integrated circuit arranged on the wiring board;
   an antenna;
   and a signal path,
   wherein the integrated circuit is arranged to generate a high frequency signal and to feed it to the signal path, the signal path is arranged to convey the high frequency signal to the antenna and the antenna is arranged to emit the high frequency signal into an environment of the electronic device;

wherein the signal path comprises a wave guide that traverses one or more of said layers, and wherein the waveguide has at least one of: a longitudinal axis which is perpendicular to said layers or a cylindrical inner space.

2. The electronic device of claim 1, wherein the wave guide has a first end near the integrated circuit, for conveying the high frequency signal between said first end and said integrated circuit by nonconductive electromagnetic coupling.

3. The electronic device of claim 1, wherein the wave guide has a second end near the antenna, for conveying the high frequency signal between said second end and said antenna by nonconductive electromagnetic coupling.

4. The electronic device of claim 1, wherein said integrated circuit is attached to said wiring board by two or more solder bumps which form part of said wave guide.

5. The electronic device of claim 1, wherein the antenna is arranged to receive the high frequency signal from said environment and to feed it to the signal path, the signal path is arranged to convey the high frequency signal to the integrated circuit, and the integrated circuit is arranged to process the high frequency signal.

6. The electronic device of claim 1, wherein the wiring board comprises three or more microvias oriented parallel to the wave guide and extending from a contour surrounding the wave guide, for shielding a region surrounding the microvias against the high-frequency signal.

7. The electronic device of claim 1, wherein the electronic device is a radar device and the high-frequency signal is a radar signal.

8. The electronic device of claim 1, wherein said integrated circuit is a first integrated circuit, said antenna is an emission antenna, said signal path is an emission signal path, said high frequency signal is an emission signal, and said electronic device further comprises:
   a second integrated circuit arranged on the wiring board;
   a reception antenna; and
   a reception signal path;
   wherein the reception antenna is arranged to receive a high frequency signal as a reception signal from said environment and to feed it to the reception signal path the reception signal path is arranged to convey the reception signal to the second integrated circuit, and the second integrated circuit is arranged to process the reception signal.

9. The electronic device of claim 8, wherein the reception signal path comprises the wave guide.

10. The electronic device of claim 8, wherein the first integrated circuit comprises a down-converter for generating a down-converted emission signal by down-converting said emission signal and said first integrated circuit is arranged to feed said down-converted emission signal to said second integrated circuit via said wiring board.

11. The electronic device of claim 8, wherein the second integrated circuit comprises a down-converter for generating a down-converted reception signal by down-converting said reception signal and said second integrated circuit is arranged to feed said down-converted reception signal to said first second integrated circuit via said wiring board.

12. An electronic device comprising:
   a wiring board having one or more layers;
   an integrated circuit arranged on the wiring board;
   an antenna;
   and a signal path,
   wherein the antenna is arranged to receive the high frequency signal from said environment and to feed it to the signal path, the signal path is arranged to convey the high frequency signal to the integrated circuit, and the integrated circuit is arranged to process the high frequency signal;
   wherein the signal path comprises a wave guide that traverses one or more of said layers, and wherein the wiring board comprises three or more microvias oriented parallel to the wave guide and extending from a contour surrounding the wave guide, for shielding a region surrounding the microvias against the high-frequency signal.

13. The electronic device of claim 12, wherein the wave guide has a first end near the integrated circuit, for conveying the high frequency signal between said first end and said integrated circuit by nonconductive electromagnetic coupling.

14. The electronic device of claim 12, wherein the wave guide has a second end near the antenna, for conveying the high frequency signal between said second end and said antenna by nonconductive electromagnetic coupling.

15. The electronic device of claim 12, wherein said integrated circuit is attached to said wiring board by two or more solder bumps which form part of said wave guide.

16. The electronic device of claim 12, wherein the waveguide has at least one of: a longitudinal axis which is perpendicular to said layers, or a cylindrical inner space.

17. The electronic device of claim 12, wherein the electronic device is a radar device and the high-frequency signal is a radar signal.

18. An electronic device comprising:
   a wiring board having one or more layers;
   an integrated circuit arranged on the wiring board;
   an antenna;
   and a signal path,
   wherein the integrated circuit is arranged to generate a high frequency signal and to feed it to the signal path, the signal path is arranged to convey the high frequency signal to the antenna and the antenna is arranged to emit the high frequency signal into an environment of the electronic device;
   wherein the signal path comprises a wave guide that traverses one or more of said layers, and wherein the antenna is arranged to receive the high frequency signal from said environment and to feed it to the signal path, the signal path is arranged to convey the high frequency signal to the integrated circuit, and the integrated circuit is arranged to process the high frequency signal.

19. An electronic device comprising:
   a wiring board having one or more layers;
   an integrated circuit arranged on the wiring board;
   an antenna;
   and a signal path,
   wherein the integrated circuit is arranged to generate a high frequency signal and to feed it to the signal path, the signal path is arranged to convey the high frequency signal to the antenna and the antenna is arranged to emit the high frequency signal into an environment of the electronic device;
   wherein the signal path comprises a wave guide that traverses one or more of said layers, and wherein the wiring board comprises three or more microvias oriented parallel to the wave guide and extending from a contour surrounding the hollow waveguide, for shielding a region surrounding the microvias against the high-frequency signal.

20. An electronic device comprising:
a wiring board having one or more layers;
an integrated circuit arranged on the wiring board;
an antenna;
and a signal path,
wherein the integrated circuit is arranged to generate a high frequency signal and to feed it to the signal path, the signal path is arranged to convey the high frequency signal to the antenna and the antenna is arranged to emit the high frequency signal into an environment of the electronic device;
wherein the signal path comprises a wave guide that traverses one or more of said layers, and wherein said integrated circuit is a first integrated circuit, said antenna is an emission antenna, said signal path is an emission signal path, said high frequency signal is an emission signal, and said electronic device further comprises:
  a second integrated circuit arranged on the wiring board;
  a reception antenna; and
  a reception signal path; wherein the reception antenna is arranged to receive a high frequency signal as a reception signal from said environment and to feed it to the reception signal path the reception signal path is arranged to convey the reception signal to the second integrated circuit, and the second integrated circuit is arranged to process the reception signal.

21. An electronic device comprising:
a wiring board having one or more layers;
an integrated circuit arranged on the wiring board;
an antenna;
and a signal path,
wherein the antenna is arranged to receive the high frequency signal from said environment and to feed it to the signal path, the signal path is arranged to convey the high frequency signal to the integrated circuit, and the integrated circuit is arranged to process the high frequency signal;
wherein the signal path comprises a wave guide that traverses one or more of said layers, and wherein the waveguide has at least one of: a longitudinal axis which is perpendicular to said layers, or a cylindrical inner space.

* * * * *